United States Patent
Lu

(10) Patent No.: US 11,112,440 B2
(45) Date of Patent: Sep. 7, 2021

(54) MEASURING DEVICE FOR LIQUID CRYSTAL DIELECTRIC CONSTANT, MEASURING APPARATUS, MEASURING METHOD

(71) Applicant: BOE Technology Group Co., Ltd., Beijing (CN)

(72) Inventor: Yongchun Lu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 161 days.

(21) Appl. No.: 16/471,797

(22) PCT Filed: Feb. 1, 2019

(86) PCT No.: PCT/CN2019/074429
§ 371 (c)(1),
(2) Date: Jun. 20, 2019

(87) PCT Pub. No.: WO2020/007043
PCT Pub. Date: Jan. 9, 2020

(65) Prior Publication Data
US 2020/0209294 A1 Jul. 2, 2020

(30) Foreign Application Priority Data
Jul. 2, 2018 (CN) .......................... 201810710418.X

(51) Int. Cl.
*G01R 27/26* (2006.01)

(52) U.S. Cl.
CPC ..... *G01R 27/2623* (2013.01); *G01R 27/2617* (2013.01); *G01R 27/2682* (2013.01); *G01R 27/26* (2013.01)

(58) Field of Classification Search
CPC ........ G01R 27/00; G01R 27/02; G01R 27/26; G01R 27/2617; G01R 27/2623; G01R 27/2682

(Continued)

(56) References Cited

U.S. PATENT DOCUMENTS

| 2009/0073332 A1* | 3/2009 | Irie | H01Q 9/0485 349/20 |
| 2012/0320287 A1* | 12/2012 | Kim | G02F 1/133603 349/2 |
| 2016/0018371 A1* | 1/2016 | Acharya | G01N 31/224 436/110 |

FOREIGN PATENT DOCUMENTS

| CN | 1601808 A | 3/2005 |
| CN | 102820512 A | 12/2012 |

(Continued)

OTHER PUBLICATIONS

International Search Report and Written Opinion (including English translations of search report and Box V of Written Opinion) for International Application No. PCT/CN2019/074429, dated Apr. 12, 2019, 12 pages.

(Continued)

*Primary Examiner* — Hoai-An D. Nguyen
(74) *Attorney, Agent, or Firm* — Westman, Champlin & Koehler, P.A.

(57) ABSTRACT

The present disclosure provides a measuring device, a measuring apparatus, and a measuring method for a dielectric constant of a liquid crystal. The measuring device includes: a first substrate and a second substrate disposed to be opposite to each other; a resonant structure layer disposed on a side of the first substrate facing the second substrate. a cavity for receiving the liquid crystal to be measured is defined between the first substrate and the second substrate. The above measuring device is applied to measurement of (Continued)

the dielectric constant of the liquid crystal in the terahertz wave band.

19 Claims, 5 Drawing Sheets

(58) Field of Classification Search
USPC ....... 324/600, 629, 633, 636, 649, 658, 663, 324/671, 674; 361/271, 301.01, 327, 500, 361/523, 524
See application file for complete search history.

(56) References Cited

FOREIGN PATENT DOCUMENTS

| | | |
|---|---|---|
| CN | 202949024 U | 5/2013 |
| CN | 103542911 A | 1/2014 |
| CN | 103675463 A | 3/2014 |
| CN | 203870169 U | 10/2014 |
| CN | 204515024 U | 7/2015 |
| CN | 106094292 A | 11/2016 |
| CN | 107394318 A | 11/2017 |
| CN | 107490727 A | 12/2017 |
| CN | 107884625 A | 4/2018 |
| CN | 108490270 A | 9/2018 |
| CN | 108872713 A | 11/2018 |
| JP | 06082835 A * | 3/1994 |
| JP | 2001-21503 A | 1/2001 |
| JP | 2005039370 A * | 2/2005 |
| JP | 2011-85525 A | 4/2011 |

OTHER PUBLICATIONS

Ge, Yi et al., "Techniques for the Measurement of Permittivity of Liquid Crystals at Millimeter—wave to Terahertz Frequencies", Electronic Sci. & Tech. /Apr. 15, 2017, Apr. 30, 2017, doi*10.16180/j.cnki.issn1007-7820.2017-04.031, © 1994-2019 China Academic Journal Electronic Publishing House, All rights reserved, http://www.cnki.net, www.dianzikeji.org, 12 pages.

Office Action, including Search Report, for Chinese Patent Application No. 201810710418.X, dated Jul. 3, 2019, 16 pages.

* cited by examiner

MEASURING DEVICE FOR LIQUID CRYSTAL DIELECTRIC CONSTANT, MEASURING APPARATUS, MEASURING METHOD

CROSS-REFERENCE TO RELATED APPLICATION

This application is a Section 371 National Stage application of International Application No. PCT/CN2019/074429, filed on 1 Feb. 2019, which has not yet published, and claims the benefit of Chinese Patent Application No. 201810710418.X, titled by "measuring device for a dielectric constant of a liquid crystal, measuring system and measuring method" and filed on Jul. 2, 2018, the whole disclosure of which is incorporated herein by reference.

TECHNICAL FIELD

The present disclosure relates to the field of liquid crystal device technologies, and in particular, to a measuring device for a dielectric constant of a liquid crystal, a measuring apparatus, and a method for measuring a dielectric constant of a liquid crystal.

DESCRIPTION OF RELATED ART

Terahertz (THz) is a frequency unit, 1 terahertz is equal to $10^{12}$ Hz, and terahertz waves are electromagnetic waves with a frequency in the range of 0.1 to 10 terahertz. In recent years, liquid crystal materials have become more and more widely used in the terahertz frequency band, and liquid crystal terahertz devices (for example, polarizers, phase shifters, wave plates, filters, etc.) can be easily tuned by changing an external electric field or an external magnetic field, and have the advantages of easy low voltage modulation, low power consumption and the like.

Accurate measurement of the dielectric constant of liquid crystal materials in the terahertz frequency band is the key to the design and analysis of liquid crystal terahertz devices.

SUMMARY

Embodiment of the present disclosure provide a measuring device for a dielectric constant of a liquid crystal, the measuring device includes:

a first substrate and a second substrate disposed to be opposite to each other; and a resonant structure layer disposed on a side of the first substrate facing the second substrate;

wherein, a cavity for accommodating the liquid crystal to be measured is defined between the first substrate and the second substrate.

In an embodiment, a first alignment film disposed on a side of the first substrate toward the second substrate and a second alignment film disposed on a side of the second substrate facing the first substrate are further included.

In an embodiment, the resonant structure layer includes at least two sets of composite resonant structures, the sets of the composite resonant structures are spaced apart from one another and each set of the composite resonant structures include a primary resonant structure and a secondary resonant structure arranged to be spaced from each other.

In an embodiment, the at least two sets of composite resonant structures are arranged at circumferentially equal intervals around an axis perpendicular to the first substrate, and the sets of the composite resonance structures are centrally symmetrically distributed with respect to an intersection of the axis with the first substrate.

In an embodiment, in each set of the composite resonant structures, the primary resonant structure includes a primary metal strip, the secondary resonant structure includes at least two secondary metal strips, the secondary metal strips are perpendicular to the primary metal strip, and the at least two secondary metal strips are symmetrically arranged relative to a perpendicular bisector of the primary metal strip.

In an embodiment, a length of the secondary metal strips is less than a length of the primary metal strip, and a width of the secondary metal strips is less than a width of the primary metal strip.

In an embodiment, the resonant structure layer includes four sets of composite resonant structures, the four sets of composite resonant structures being arranged at circumferentially equal intervals around an axis perpendicular to the first substrate and shortest distances from the four sets of composite resonant structures to the axis are equal to one another, i.e. the four sets of composite resonant structures are centrally symmetrically distributed with respect to an intersection of the axis with the first substrate; in each set of the composite resonant structures, the primary resonant structure includes a primary metal strip, the secondary resonant structure includes two secondary metal strips, the two secondary metal strips are perpendicular to the primary metal strip, the two secondary metal strips are symmetrically arranged with respect to a perpendicular bisector of the primary metal strip, and the secondary metal strips are located at a side of the primary metal strip away from the axis.

In an embodiment, the resonant structure layer is made of a metal.

In an embodiment, the resonant structure layer has a thickness ranged from 0.01 μm to 5 μm.

In an embodiment, the cavity has a thickness ranged from 3 μm to 500 μm.

In an embodiment, the first alignment film has a same alignment orientation as the second alignment film.

In an embodiment, the first alignment film covers the resonant structure layer.

In an embodiment, a frame is provided between the first substrate and the second substrate, the frame together with the first substrate and the second substrate defining the cavity for accommodating the liquid crystal to be measured.

In an embodiment, the frame is made of a sealant, and the frame includes a liquid crystal injection port for injecting the liquid crystal to be measured into the cavity.

As an aspect, embodiments of the present disclosure provide a method of measuring a dielectric constant of a liquid crystal, wherein the method includes: preparing a measuring device containing the liquid crystal to be measured, the measuring device being a measuring device for a dielectric constant of a liquid crystal as described in the above aspect; irradiating the measuring device with a terahertz electromagnetic wave in a direction perpendicular to a plane where the measuring device is located with a polarization direction of the terahertz electromagnetic wave being parallel to a long axis of the liquid crystal in the measuring device, receiving the terahertz electromagnetic wave transmitted through the measuring device, and obtaining a first curve of an intensity of the transmitted terahertz electromagnetic wave as a function of a frequency; irradiating the measuring device with the terahertz electromagnetic wave in the direction perpendicular to a plane where the measuring device is located with the polarization direction of the terahertz electromagnetic wave being perpendicular to the long axis of the liquid crystal in the measuring device, receiving the terahertz electromagnetic wave transmitted through the measuring device, and obtaining a second curve of the intensity of the transmitted terahertz electromagnetic wave as the function of the frequency; finding a dielectric constant of the liquid crystal matching the first curve based on the first curve, and using the dielectric constant as a dielectric constant in the long axis direction of the liquid crystal, and finding a dielectric constant of the liquid crystal matching the second curve based on the second curve, and using the dielectric constant as a dielectric constant in the short-axis direction of the liquid crystal.

In an embodiment, the dielectric constant of the liquid crystal matching the first curve is found based on the first curve by using a simulation method; and the dielectric constant of the liquid crystal matching the second curve is found based on the second curve by using a simulation method.

In an embodiment, the step of finding the dielectric constant of the liquid crystal in long axis direction and the dielectric constant of the liquid crystal in the short axis direction by using a simulation method includes: establishing a simulation model according to a measurement experimental model of the steps of obtaining the first curve and the second curve; adjusting the dielectric constant of the liquid crystal in the long axis direction in the simulation model, so that the simulation result obtained is consistent with the first curve and a corresponding dielectric constant of the liquid crystal in the long axis direction is the dielectric constant in the long axis direction of the liquid crystal to be measured; adjusting the dielectric constant of the liquid crystal in the short axis direction in the simulation model, so that the simulation result obtained is consistent with the second curve and a corresponding dielectric constant of the liquid crystal in the short axis direction is the dielectric constant in the short axis direction of the liquid crystal to be measured.

As an aspect, embodiments of the present disclosure provide a measuring apparatus for a dielectric constant of a liquid crystal, the measuring apparatus includes: the measuring device for a dielectric constant of a liquid crystal as described in the above aspect; a terahertz electromagnetic wave source disposed at a side of the measuring device in a direction perpendicular to a plane where the measuring device is located; a signal receiver disposed at the other side of the measuring device; a spectrum analyzer connected to both the terahertz electromagnetic wave source and the signal receiver and configured for generating, according to a terahertz electromagnetic wave emitted by the terahertz electromagnetic wave source and the terahertz electromagnetic wave that is received by the signal receiver, a first curve and a second curve of an intensity of the terahertz electromagnetic wave transmitted as a function of a frequency.

In an embodiment, one of the terahertz electromagnetic wave source and the signal receiver is located at a side of the second substrate facing away from the first substrate, and the other is located at a side of the first substrate facing away from the second substrate.

In an embodiment, the measuring apparatus further includes: a processor coupled to the spectrum analyzer and configured for performing a simulation derivation to obtain a dielectric constant in a long axis direction of the liquid crystal corresponding to the first curve and a dielectric constant in a short axis direction of the liquid crystal corresponding to the second curve.

BRIEF DESCRIPTION OF THE DRAWINGS

In order to more clearly illustrate embodiments of the present disclosure or the technical solutions in the prior art, the drawings to be used in description of the embodiments or the prior art will be briefly described below. Obviously, the drawings in the following description are only some embodiments of the present disclosure. Other drawings may be obtained by those skilled in the art without inventive labor according to the drawings in the present disclosure.

DETAILED DESCRIPTION

In order to make the above described objects, features and advantages of the present disclosure be more clearly understood, technical schemes in embodiments of the present disclosure will be definitely and completely described in conjunction with the drawings of the embodiments of the present disclosure. It is apparent that the described embodiments are only a part of the embodiments of the present disclosure, and not all of them. All other embodiments obtained by a person of ordinary skill in the art based on the embodiments of the present disclosure without inventive labor are fallen in the scope of the disclosure.

For measurement of a dielectric constant of a liquid crystal material in the terahertz frequency band, in the related art, the liquid crystal is poured into a resonant cavity composed of a terahertz semipermeable membrane, and then the cavity is irradiated with a terahertz wave, so as to determine its resonant frequency according to a transmission characteristic of the cavity, and in turn to induce in reverse manner the dielectric constant of the liquid crystal poured in the cavity. There are many shortcomings in the above measuring methods, including, for example, (1) measurement sensitivity and measurement accuracy are low since a quality factor of the resonant cavity is relatively low; (2) a measuring device has a complex structure and a high cost as it is formed by at least four parts including a terahertz semipermeable membrane, an additional bias electrode, an alignment film, and a liquid crystal layer; (3) a measurement time is long and a measurement efficiency is low, and the like because a thickness of the liquid crystal layer is very thick, and both of the bias electrodes and the alignment film are required to change an orientation of the liquid crystal molecules during a measurement process and thus a reaction speed of the liquid crystal is slow.

Figure 1:
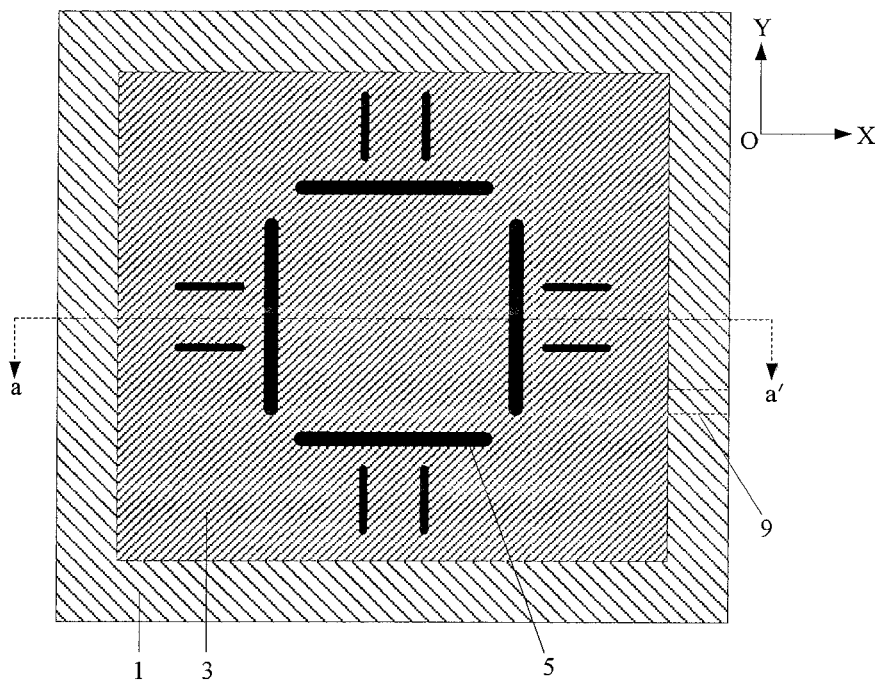
FIG. 1 is a plan structural view of a measuring device according to an embodiment of the present disclosure.
Figure 2:
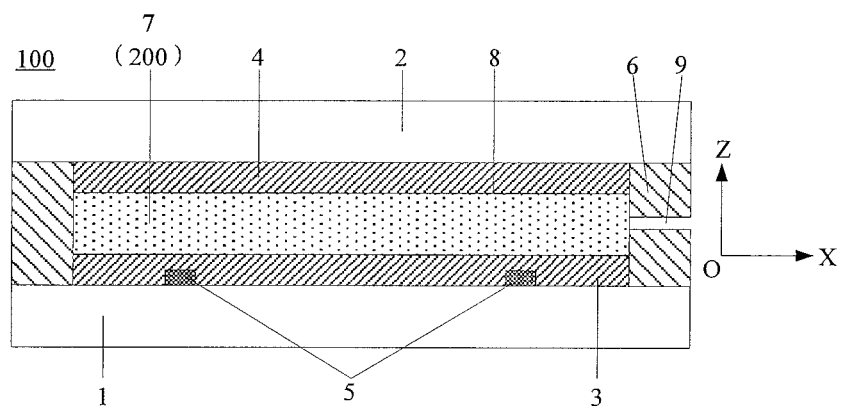
FIG. 2 is a cross-sectional structural view of the measuring device shown in FIG. 1 along a broken line aa'.

Embodiments of the present disclosure provide a measuring device for a dielectric constant of a liquid crystal. Referring to FIG. 1 and FIG. 2, the measuring device includes: a first substrate 1 and a second substrate 2 disposed to be opposite to each other; and a resonant structure layer 5 on a side of the first substrate facing the second substrate; wherein a cavity 8 for accommodating the liquid crystal to be measured is defined between the first substrate 1 and the second substrate 2. In the embodiment, the resonant structure layer 5 may output a planar electric field when be inputted an electric signal, thereby controlling an orientation of the liquid crystal, so that the measuring device of the embodiment is only needed to include a single resonant structure layer 5 to achieve measurement of the dielectric constant of the liquid crystal. In the embodiment, the resonant structure layer 5 may include at least two conductive electrodes or metal wires or metal blocks that are separated, and a shape and arrangement of the conductive electrodes or metal wires or metal blocks may be various, as long as the at least two electrodes are separated such that a planar electric field may be formed between the at least two electrodes, and the planar electric field can affect the orientation and arrangement of the liquid crystals in the vicinity.

Embodiments of the present disclosure provide a measuring device for a dielectric constant of a liquid crystal. As shown in FIG. 1 and FIG. 2, the measuring device 100 includes: a first substrate 1 and a second substrate 2 disposed to be opposite to each other; a resonant structure layer 5 and a first alignment film 3 that are disposed on a side, facing the second substrate 2, of the first substrate 1; a second alignment film 4 disposed on a side, facing the first substrate 1, of the second substrate 2; wherein the first substrate and the second substrate define a cavity 8 therebetween. In the embodiment, as shown in FIG. 2, for example, the resonant structure layer 5 is located on a side, facing the second substrate 2, of the first substrate 1, and the first alignment film 3 may alternatively be located on the side, facing the second substrate 2, of the first substrate 1. The resonant structure layer 5 can be considered to be located in the first alignment film 3. However, in other embodiments, this is not required, and an alignment film is not necessary. However, provision of an alignment film may further improve orientation of the liquid crystal and thus the performance of liquid crystal orientation.

In one embodiment, a frame 6 may be disposed between the first substrate and the second substrate, and the frame 6, together with the first substrate 1 and the second substrate 2, defines a cavity 8 for accommodating a to-be-measured liquid crystal 200. The frame 6 has a function of preventing the liquid crystal 200 from leaking out of the cavity and is used as a support for maintaining a gap between the first substrate 1 and the second substrate 2 that is a space for the liquid crystal 200 disposed between the first substrate 1 and the second substrate 2. When the dielectric constant of the liquid crystal is measured using the above-described measuring device 100, the liquid crystal 200 to be measured is poured into the cavity 8 between the first substrate 1 and the second substrate 2 of the measuring device 100. After that, the first alignment film 3 on the first substrate 1 and the second alignment film 4 on the second substrate 2 are in direct contact with the liquid crystal 200 to align an orientation of molecules of the liquid crystal 200. The measurement can then be started.

It is noted that, in the embodiments of the present disclosure, a plane determined by the measuring device 100 (which may also be regarded as the plane determined by the first substrate 1 or the second substrate 2) is assumed as an XOY plane; a direction perpendicular to the plane (i.e., the XOY plane) determined by the measuring device 100 and pointing from the first substrate 1 to the second substrate 2 is a Z direction.

In the above-described measuring device for a dielectric constant of a liquid crystal, a resonant structure layer is formed on a side of the second substrate. In practice of measurement, after the liquid crystal to be measured is poured into the measuring device, a terahertz electromagnetic wave is implemented to irradiate the measuring device 100 in the Z direction or an opposite direction to the Z direction. As the terahertz electromagnetic wave can be coupled with a resonant structure in the resonant structure layer 5 to generate resonance, while the anisotropic dielectric constant of the liquid crystal 200 can have different effects on the generated resonance, and the effects may be reflected by a curve of a change of an intensity of the terahertz electromagnetic wave transmitted through the measuring device 100 with a frequency, the dielectric constant of the liquid crystal 200 in a long-axis direction and that in a short-axis direction may be obtained according to the curve of the change of the intensity of the terahertz electromagnetic wave transmitted through the measuring device 100 with the frequency, thereby achieving measurement of the dielectric constant of the liquid crystal 200 in the terahertz frequency band.

The curve of the change of the intensity of the transmitted terahertz electromagnetic wave with a frequency obtained by using the above measuring device 100 to measure the dielectric constant of the liquid crystal 200 in the terahertz frequency band has a rather significant resonance peak, and the resonance is strong, which indicates the resonant structure in the resonant structure layer 5 has an extremely high quality factor. That is, sensitivity and measurement accuracy of the measuring device 100 are great. Further, the above described measuring apparatus 100 does not need to be provided with a bias electrode, and the resonant structure in the resonant structure layer 5 is not needed to be connected to any signal line, and no ground electrode is needed. That is to say, the resonant structure can work completely without applying a control electric field, and thus the above-mentioned measuring device 100 has a simple structure and a low manufacturing cost. In addition, a measuring process of the above measuring device is very simple, and the liquid crystal 200 is not required to be deflected in response to the control electric field during measurement so that a measurement speed is fast and measurement efficiency is high.

In the above-described measuring device 100, a structure designing for the resonant structure layer 5 is important for the accuracy and the sensitivity of the measurement, and some possible designs are exemplarily given as below.

Figure 3:
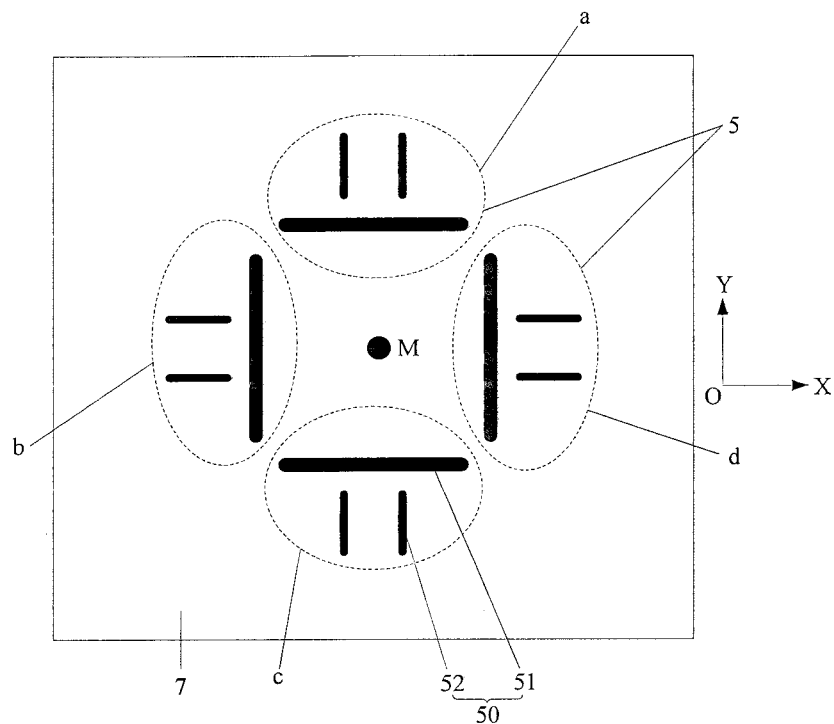
FIG. 3 is a plan structural view showing a resonant structure layer in a measuring device according to an embodiment of the present disclosure.

Referring to FIG. 3, the resonant structure layer 5 may include at least two sets of composite resonant structures 50, and the sets of composite resonant structures 50 are spaced apart from one another to achieve mutual insulation, so that each set of composite resonant structures 50 can be coupled with the incident terahertz electromagnetic waves to generate resonance. Further, multiple sets of composite resonant structures 50 can interact with one another to obtain enhanced resonance.

For example, four sets of composite resonant structures 50 are included in FIG. 3, and each set of the composite resonant structures 50 includes a primary resonant structure 51 and a secondary resonant structure 52 spaced apart from and insulated from one another. When a terahertz electromagnetic wave is incident, it is coupled with the primary resonant structure 51, so that the primary resonant structure 51 generates an induced electromagnetic field, the induced electromagnetic field causes the secondary resonant structure 52 to generate an induced electromagnetic signal, and in turn the induced electromagnetic signal from the secondary resonant structure 52 affects the induced electromagnetic field generated by the primary resonant structure. In some cases, the incident terahertz electromagnetic wave may be coupled with both the primary resonant structure 51 and the secondary resonant structure 52; the quality factor of resonance can be improved by means of mutual induction and coupled between the primary resonant structure 51 and the secondary resonant structure 52, which is beneficial to enhance the accuracy and sensitivity of measurement.

Referring to FIG. 3 continuously, the four sets of composite resonant structures 50 of the resonant structure layer 5 can be equally spaced and arranged along a periphery around an axis M (parallel to the Z direction) perpendicular to the plane of the first substrate 1, and shortest distances of the sets of composite resonant structures 50 distanced from the axis M are equal to each other. In other words, the sets of the composite resonant structures 50 are centrally symmetrically distributed with respect to an intersection of the axis M with the first substrate. With this configuration, the composite resonant structures 50 in the resonant structure layer 5 are arranged in a uniform and symmetrical form, which is advantageous for improving the quality factor. It should be noted that since the axis M is perpendicular to the XOY plane, the axis M in FIG. 3 is shown as only a point.

According to embodiments of the present disclosure, for a regularly shaped measuring device, the axis M can pass through a center of the measuring device such that the composite resonant structures 50 are arranged in a uniform, symmetrical form with respect to the center of the measuring device as a reference point, which is advantageous for improving the quality factor.

In each set of the composite resonant structures 50, the respective structures of the primary resonant structure 51 and the secondary resonant structure 52, and the relative positional relationship therebetween are not limited to a single form, for example, that shown in FIG. 3.

As a possible embodiment, as shown in FIG. 3, in each set of composite resonant structures 50, the primary resonant structure 51 includes a primary metal strip, and the secondary resonant structure 52 includes at least two secondary metal strips. The secondary metal strips are perpendicular to the primary metal strip and are arranged symmetrically relative to a perpendicular bisector of the primary metal strip. Further, a length of the secondary metal strips may be less than a length of the primary metal strip, and a width of the secondary metal strips may be less than a width of the primary metal strip making the master-slave relationship between the two more obvious.

A specific example is given below. Referring again to FIG. 3, the resonant structure layer 5 includes four sets of composite resonant structures 50, numbered a, b, c, and d, respectively. The four sets of composite resonant structures a, b, c, and d are circumferentially equally spaced and arranged around an axis M (the axis M is perpendicular to the first substrate 1, i.e., perpendicular to the XOY plane), and shortest distances from the sets of composite resonant structures distanced to the axis M are equal to each other.

In each set of the composite resonant structures, the primary resonant structure 51 includes a primary metal strip, and the secondary resonant structure 52 includes two secondary metal strips, the secondary metal strips are perpendicular to the primary metal strip and are symmetrically arranged relative to the perpendicular bisector of the metal strip; the secondary metal strips are located at a side of the primary metal strip that is remote from the axis M. The shortest distances of the sets of composite resonant structures distanced to the axis M being equal to each other means that vertical distances of the primary metal strips of the sets of the composite resonant structures to the axis M are equal to each other, or the sets of the composite resonant structures are centrally symmetrically distributed with respect to the axis M. The composite resonant structure a and the composite resonant structure c are arranged symmetrically or in mirror symmetry with respect to the axis M, and the composite resonant structure b and the composite resonant structure d are symmetrically or in mirror symmetry arranged with respect to the axis M. Through the above structural design, the resonant structures of the resonant structure layer 5 can have a high quality factor.

For the various designs of dimensions of the above-mentioned resonant structure layer 5, different size specifications of the measuring device should be adapted for different size designs.

In one embodiment, one set of sides of the measuring device 100 are parallel to the X direction and the other set of sides are parallel to the Y direction. In the resonant structure layer 5 of the measuring device 100, the primary metal strips 51 of the composite resonant structure a and the composite resonant structure c are parallel to the X direction, and the secondary metal strips 52 of them are parallel to the Y direction; and the primary metal strips 51 of the composite resonant structure b and the composite resonant structure d are parallel to the Y direction, and the secondary metal strips 52 of them are parallel to the X direction. The composite resonant structures a, b, c, and d are arranged around the axis M, the axis passing through the center of the first substrate 1.

Figure 4:
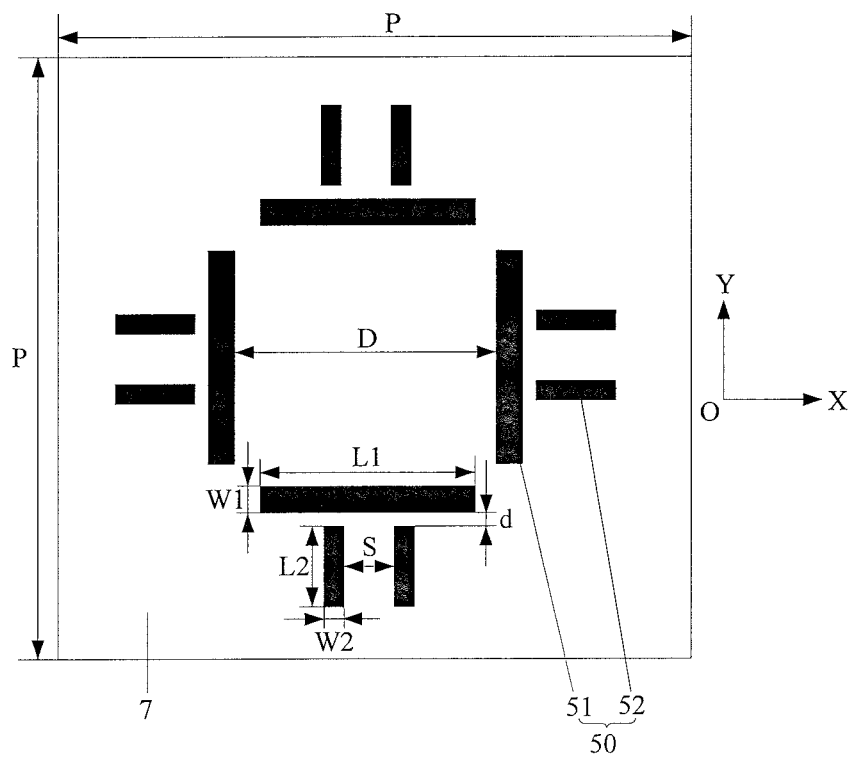
FIG. 4 is a dimensional design diagram of components of a resonant structure layer in a measuring device according to an embodiment of the present disclosure.

Referring to FIG. 4, a side of an orthographic projection, on the XOY plane, of the liquid crystal layer 7 corresponding to the resonant structure layer 5 according to the embodiment of the present disclosure may have a length P ranged from 510 μm to 810 μm. For example, in one embodiment it can be 660 μm. The spacing D between the primary metal strips 51 of the composite resonant structure a and the composite resonant structure c that are arranged in mirror symmetry may be ranged from 110 μm to 310 μm, for example, may be 210 μm in one embodiment. Similarly, the spacing D between the primary metal strips 51 of the composite resonant structure b and the composite resonant structure d that are arranged in mirror symmetry may be ranged from 110 μm to 310 μm, for example, may be 210 μm in one embodiment.

According to embodiments of the present disclosure, in each composite resonant structure, a length L1 of the primary metal strips 51 may be ranged from 78 μm to 178 μm. For example, in one embodiment, the length L1 may be 128 μm. A width W1 of the primary metal strips 51 may be ranged from 25 μm to 75 μm, for example, may be 50 μm in one embodiment. A length L2 of the secondary metal strips 52 may be ranged from 50 μm to 150 μm, for example, in one embodiment, it may be 100 μm, and a width W2 of the secondary metal strips 52 may be in the range of 15 μm~45 μm, for example, may be 30 μm in one embodiment. A value of a gap d between the primary metal strip 51 and the secondary metal strips 52 may be ranged from 25 μm to 75 μm, for example may be 50 μm in one embodiment. The spacing S between the two secondary metal strips 52 may be ranged from 15 μm to 45 μm, for example may be 30 μm in one embodiment.

In the embodiment, the resonant structure layer 5 is made of a conductive material. For example, in one embodiment, the resonant structure layer 5 is made of a metal such as metal such as gold, silver, copper, or aluminum and et al.

A thickness of the resonant structure layer 5 may be ranged from 0.01 μm to 5 μm, for example 1 μm in one embodiment.

In one embodiment, a process of manufacturing the resonant structure layer 5 may include: first forming a thin film having a designed thickness by using a material for forming a resonant structure, and then removing a specific portion of the formed thin film by a photolithography process the retained portion of the formed thin film forming the resonant structure as required.

A thickness of the cavity 8 formed between the first substrate 1 and the second base 2, which may be regarded as a thickness of the poured liquid crystal layer 7, may be ranged from 3 μm to 500 μm, for example, in one embodiment may be 50 μm.

A thickness of each of the first substrate 1 and the second substrate 2 may be ranged from 100 μm to 1000 μm, for example, 160 μm in one embodiment. The dielectric constant of the first substrate 1 and the second substrate 2 may be ranged from 1.1 to 20, for example 3.8 in one embodiment.

An alignment direction of the first alignment film 3 and the second alignment film 4 may be uniform such that the liquid crystal to be measured has a uniform orientation after being injected into the cavity 8 of the measuring device 100.

The alignment direction of the first alignment film 3 and the second alignment film 4, that is, the orientation of the liquid crystal to be measured (the orientation described herein specifically refers to the orientation of the long axis of the liquid crystal molecule), may be oriented along the X direction, or in the Y direction, or in any other direction in the XOY plane.

The material of which the frame 6 is made may be selected as a frame sealant. In some embodiments, a liquid crystal injection port 9 (see FIGS. 1 and 2) may be disposed in the frame 6. When the dielectric constant of the liquid crystal is measured by using the above measuring device 100, the liquid crystal 200 to be measured is firstly poured into the cavity 8 through the liquid crystal injection port 9, and then the measurement of the dielectric constant can be started. It should be noted that after the liquid crystal 200 is injected, the liquid crystal injection port 9 may be blocked by using a frame material (such as the frame sealant) to prevent the injected liquid crystal 200 from leaking during measurement.

In some embodiments, the liquid crystal injection port 9 can be designed to be in a small size, so that the liquid crystal 200 will not be leaked after it is injected without blocking the liquid crystal injection port 9.

The above is a description of the structure of the measuring device 100 for a dielectric constant of a liquid crystal proposed in the present disclosure. Next, a method of measuring a dielectric constant of a liquid crystal in the terahertz frequency band using the measuring device 100 for a dielectric constant of a liquid crystal will be described.

Figure 5:
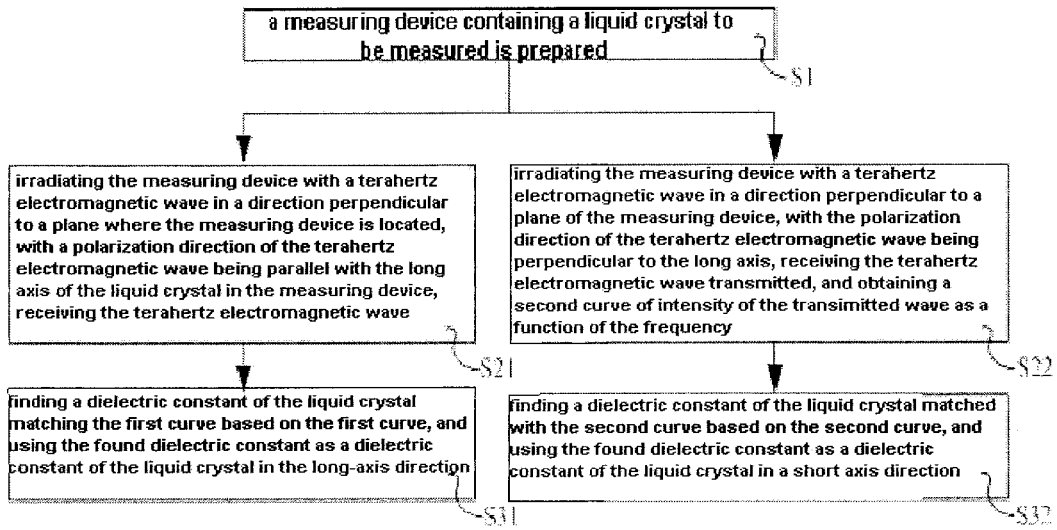
FIG. 5 is a basic flowchart of a measuring method provided by an embodiment of the present disclosure.

A method of measuring a dielectric constant of a liquid crystal according to an embodiment of the present disclosure, including the following steps, will be described below with reference to FIG. 5.

A step S1 is included: a measuring device containing a liquid crystal to be measured is prepared, the measuring device may be the measuring device for a dielectric constant of a liquid crystal as described in the above embodiments of the present disclosure.

In the above step, the liquid crystal to be measured may be injected into the cavity 8 of the measuring device to complete the preparation work.

A step S21 is included: irradiating the measuring device with a terahertz electromagnetic wave in a direction perpendicular to a plane where the measuring device is located, with a polarization direction of the terahertz electromagnetic wave being parallel with the long axis of the liquid crystal in the measuring device, receiving the terahertz electromagnetic wave transmitted through the measuring device and obtaining a first curve of the intensity of the transmitted wave as a function of the frequency.

Figure 8:
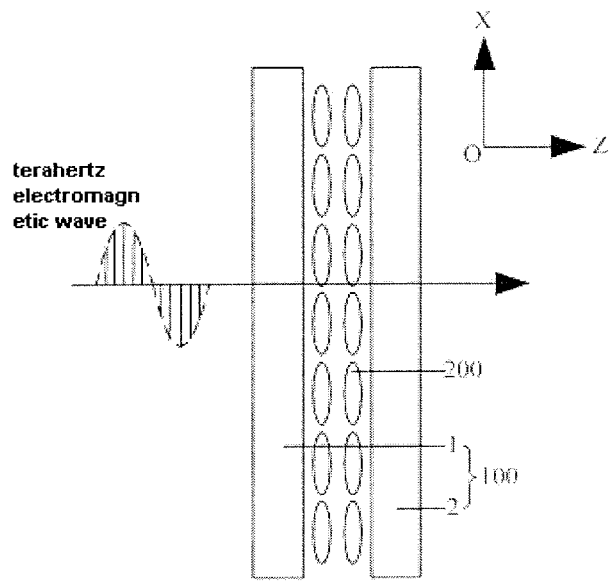
FIG. 8 is another schematic diagram of a measuring method according to an embodiment of the present disclosure.

In the above step, exemplarily, as shown in FIG. 8, assuming that the orientation direction of the liquid crystal 200 in the measuring device (specifically, the orientation direction of the long axis of the liquid crystal 200) is parallel to the X direction, when the measuring device 100 is placed, the long axis of the liquid crystal 200 should be coincide with the polarization direction of the terahertz electromagnetic wave, both parallel to the X direction. The terahertz electromagnetic wave irradiates the measuring device 100 in the Z direction.

Figure 9:
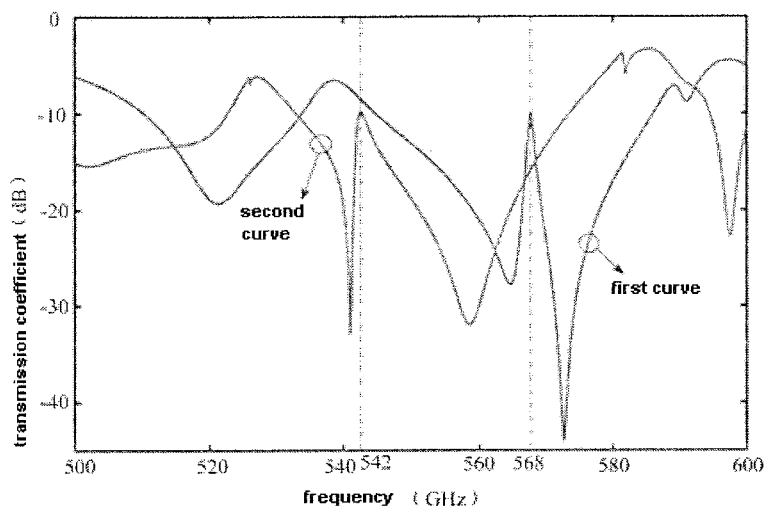
FIG. 9 is a diagram of a first curve and a second curve obtained in a measuring method provided by an embodiment of the present disclosure.

When the incident terahertz electromagnetic wave is coupled with the resonance structure in the measuring device 100 to generate a resonance, the dielectric constant of the liquid crystal 200 in the long-axis direction will have an effect on the resonance since the long axis direction of the liquid crystal 200 coincides with the polarization direction of the terahertz electromagnetic wave. Referring to FIG. 9, the first curve of the intensity of the transmitted wave as the function of frequency is obtained by receiving, at the second substrate side of the measuring device 100, a transmitted wave of the terahertz electromagnetic wave. It should be noted that the transmission coefficient in the vertical axis in FIG. 9 characterizes the transmitted wave intensity. As can be seen from the first curve, there is a significant resonance peak near 568 GHz in the horizontal axis, which is caused by the dielectric constant of the liquid crystal 200 in the long axis direction.

It is worth mentioning that the first curve has a strong resonance at the resonance peak and the quality factor is extremely high, which means that the measuring device 100 has extremely high precision.

A step S22 is included: irradiating the measuring device with a terahertz electromagnetic wave in a direction perpendicular to a plane of the measuring device, with the polarization direction of the terahertz electromagnetic wave being perpendicular to the long axis of the liquid crystal in the measuring device, receiving the terahertz electromagnetic wave transmitted through the measuring device, and obtaining a second curve of intensity of the transmitted wave as a function of the frequency.

Figure 7:
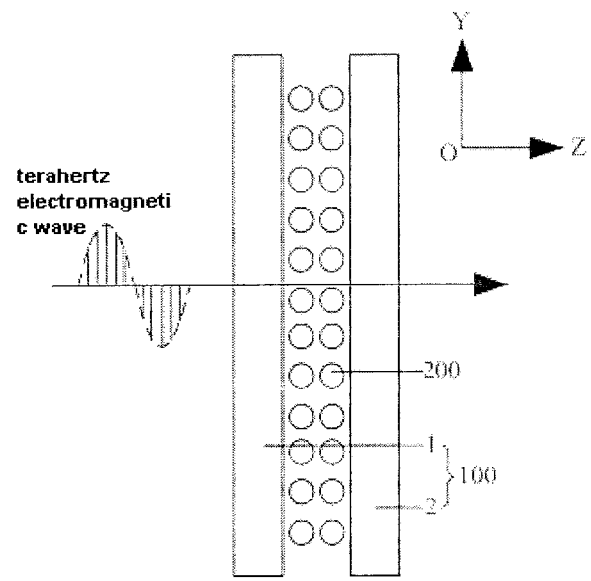
FIG. 7 is a schematic diagram of a measuring method according to an embodiment of the present disclosure.

In the above steps, exemplarily, as shown in FIG. 7, assuming that the orientation direction of the liquid crystal 200 in the measuring device (specifically, the orientation direction of the long axis of the liquid crystal 200) is parallel to the X direction, when the measuring device 100 is placed, the long axis of the liquid crystal 200 should be perpendicular to the polarization direction of the terahertz electromagnetic wave so that the short axis of the liquid crystal 200 coincides with the polarization direction of the terahertz electromagnetic wave, both parallel to the Y direction. The terahertz electromagnetic waves is used to irradiate the measuring device 100 in the Z direction.

When the incident terahertz electromagnetic wave is coupled with the resonance structure in the measuring device 100 to generate a resonance, the dielectric constant the liquid crystal 200 in the short axis direction will have an effect on the resonance since the short axis of the liquid crystal 200 coincides with the polarization direction of the terahertz electromagnetic wave. Referring to FIG. 9, the second curve of the intensity of the transmitted wave as a function of frequency is obtained by receiving the transmitted wave of the terahertz electromagnetic wave at the second substrate 2 side of the measuring device 100.

As can be seen from the second curve, there is a significant resonance peak near 542 GHz in the horizontal axis which is caused by the dielectric constant in the short-axis direction of the liquid crystal 200. It is worth mentioning that the resonance of the second curve at the resonance peak is very strong and the quality factor is extremely high, which means that the measuring device 100 has extremely high precision.

It should be noted that, in practice, the above steps S21 and S22 are not limited in an precedence order when being performed, that is, it is possible to perform step S21 and then step S22, and further, before the step S22 is performed, there is no need to adjust a position of a wave source for transmitting the terahertz electromagnetic wave and a position of a signal receiver for receiving the transmitted wave of the terahertz electromagnetic wave, but only need to rotate the measuring device 100 by 90° in the XOY plane. Similarly, it is possible to perform step S22 and then step S21, and further, before the step S21 is performed, there is no need to adjust a position of a wave source for transmitting the terahertz electromagnetic wave and a position of a signal receiver for receiving the transmitted wave of the terahertz electromagnetic wave, but only need to rotate the measuring device 100 by 90° in the XOY plane.

A step of S31 is included: finding a dielectric constant of the liquid crystal matching the first curve based on the first curve, and using the found dielectric constant as a dielectric constant of the liquid crystal in the long-axis direction. There are various methods for obtaining the liquid crystal dielectric constant matching the first curve based on the first curve. According to an embodiment of the present disclosure, a dielectric constant of the liquid crystal matching the first curve is found based on the first curve by using a simulation method, and the found dielectric constant is used as the dielectric constant of the liquid crystal in the long-axis direction.

Figure 6:
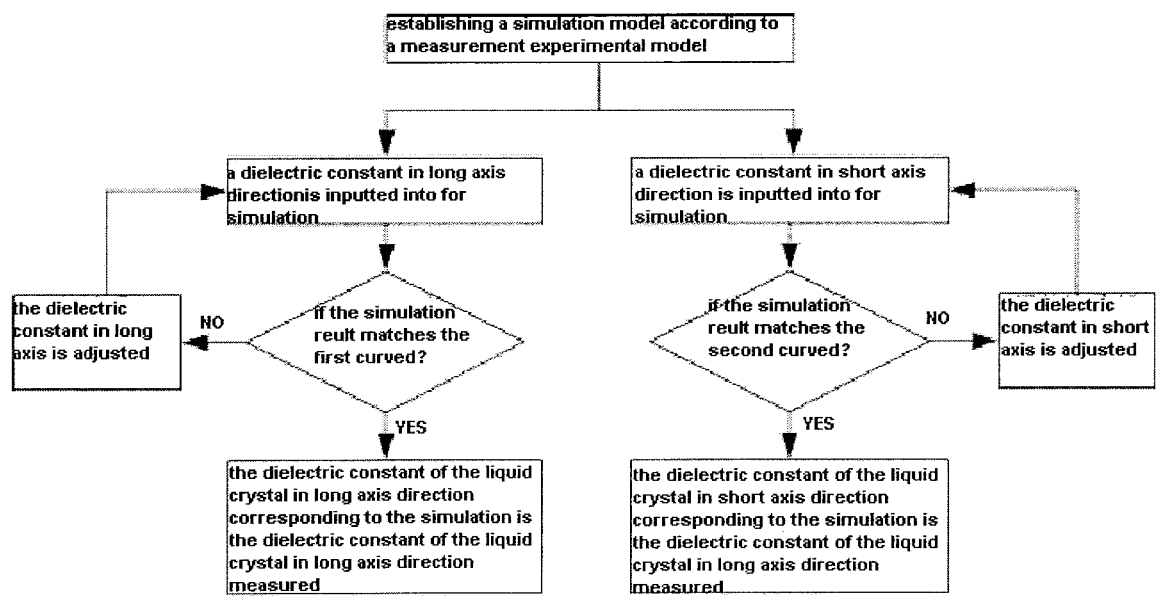
FIG. 6 is a specific flowchart of a certain step in a measuring method according to an embodiment of the present disclosure.

Referring to FIG. 6, in the above step S31, the dielectric constant of the liquid crystal in the long axis direction being obtained by using a simulation method may specifically include the following processes:

firstly, a simulation model is established according to a measurement experiment model corresponding to the steps of obtaining the first curve and the second curve. The so-called "measurement experimental model corresponding to the step of obtaining the first curve and the second curve" includes acquiring various parameters involved in performing measurement using the measuring device 100, including dimensions of components and structures in the measuring device 100 et al. Exemplarily, in the "measurement experimental model corresponding to the step of obtaining the first curve and the second curve", the thickness of the liquid crystal layer 7 in the measuring device 100 is 50 μm, and the thicknesses of the first substrate 1 and the second substrate 2 are both 160 μm, a dielectric constant of the two is 3.8, the thickness of the resonant structure layer 5 is 1 μm, the resonant structure in the resonant structure layer 5 adopts the structure as shown in FIG. 3 and FIG. 4, and the various dimensional parameters are shown in Table 1 as below:

TABLE 1

| (unit: μm) | | | | | | | |
|---|---|---|---|---|---|---|---|
| S | P | L1 | L2 | W1 | W2 | D | d |
| 30 | 660 | 128 | 100 | 50 | 30 | 210 | 50 |

When establishing a simulation model, the above parameters are referred.

Then, the dielectric constant of the liquid crystal in the long axis direction in the simulation model is adjusted, so that the obtained simulation result coincides with the first curve, and the corresponding dielectric constant of the liquid crystal in the long axis direction is determined as the dielectric constant of the liquid crystal to be measured in the long axis direction.

Continuing to refer to FIG. 6, in this process, an initial dielectric constant of liquid crystal in the long axis direction and that in the short axis direction are needed to be set firstly, and are inputted into the simulation model for simulation; for example, the initial dielectric constant of the liquid crystal in the long axis direction is set as 3 and the initial dielectric constant of the liquid crystal in the short axis direction is set as 2 and the liquid crystal is aligned in the X direction. Therefore, in the simulation model, the dielectric constant tensor of the liquid crystal in the X, Y, and Z directions is (3, 2, 2).

After the initial liquid crystal dielectric constants have been inputted, by simulation, a curve of the intensity of the corresponding transmitted wave as a function of the frequency may be obtained, and the curve is compared with the first curve obtained by measurement in the step of S21 to determine whether the two match each other or not. If they do not match, it is indicated that the set dielectric constant of the liquid crystal in the long-axis direction corresponding the simulation is not suitable and is needed to be adjusted. The adjusted dielectric constant of the liquid crystal in the long-axis direction is then inputted into the simulation model again for simulation. The above mentioned determining and adjustment process is repeated until the simulation curve matching the first curve is found and the dielectric constant of the liquid crystal in long axis direction corresponding to the simulation is the dielectric constant of the liquid crystal in long axis direction measured in step of S21. If they match, it is indicated that the set dielectric constant of the liquid crystal in the long axis direction corresponding the simulation is the dielectric constant of the liquid crystal in the long axis direction measured in the step S21.

A step of S32 is included: finding a dielectric constant of the liquid crystal matched with the second curve based on the second curve, and using the found dielectric constant as a dielectric constant of the liquid crystal in a short axis direction. There are various ways to obtain the liquid crystal dielectric constant matched with the second curve based on the second curve. According to an embodiment of the present disclosure, a dielectric constant of the liquid crystal matched with the second curve is found based on the second curve by using a simulation method, and the found dielectric constant is used as a dielectric constant of the liquid crystal in a long axis direction.

As shown in FIG. 6, referring to a specific introduction of the above step of S31, in the above step of S32, the dielectric constant of the liquid crystal in the short axis direction being obtained by using a simulation method, may specifically include the following process: adjusting the dielectric constant of the liquid crystal in the short-axis direction in the simulation model based on the previously established simulation model such that the obtained simulation result coincides with the second curve. In this case, the corresponding dielectric constant of the liquid crystal in the short-axis direction is the dielectric constant of the liquid crystal to be measured in the short-axis direction. Continue to refer to FIG. 6, the set initial dielectric constants of the liquid crystal in the long-axis direction and in the short-axis direction are inputted into the simulation module and the simulation is performed. The corresponding curve of the intensity of the transmitted wave as a function of the frequency may be obtained. The curve is compared to the second curve measured in step of S22 to determine whether they match with each other or not. If not, it is indicated that the set dielectric constant of the liquid crystal in the short-axis direction is not suitable, and is needed to be adjusted. The adjusted dielectric constant of the liquid crystal in the short-axis direction is inputted into the simulation model again, and the simulation is repeated. The determining and adjustment are repeated until a simulation curve matched with the second curve is found, and the dielectric constant in the short axis direction of the liquid crystal corresponding to the simulation is the dielectric constant in the short axis direction of the liquid crystal measured in step of S22. If match, it is indicated that the dielectric constant in the short-axis direction of the liquid crystal corresponding to the simulation is the dielectric constant of the liquid crystal in the short-axis direction measured in step of S22.

It should be noted that, the above steps S31 and S32 are not limited in an precedence order when being actually performed. That is, it is possible to perform the step of S31 and then the step of S32, or it is possible to perform the step of S32 and then the step of S31.

In addition, the method provided by the present disclosure is applicable to the measurement of a dielectric constant of the nematic liquid crystal in the terahertz wave frequency band.

Figure 10:
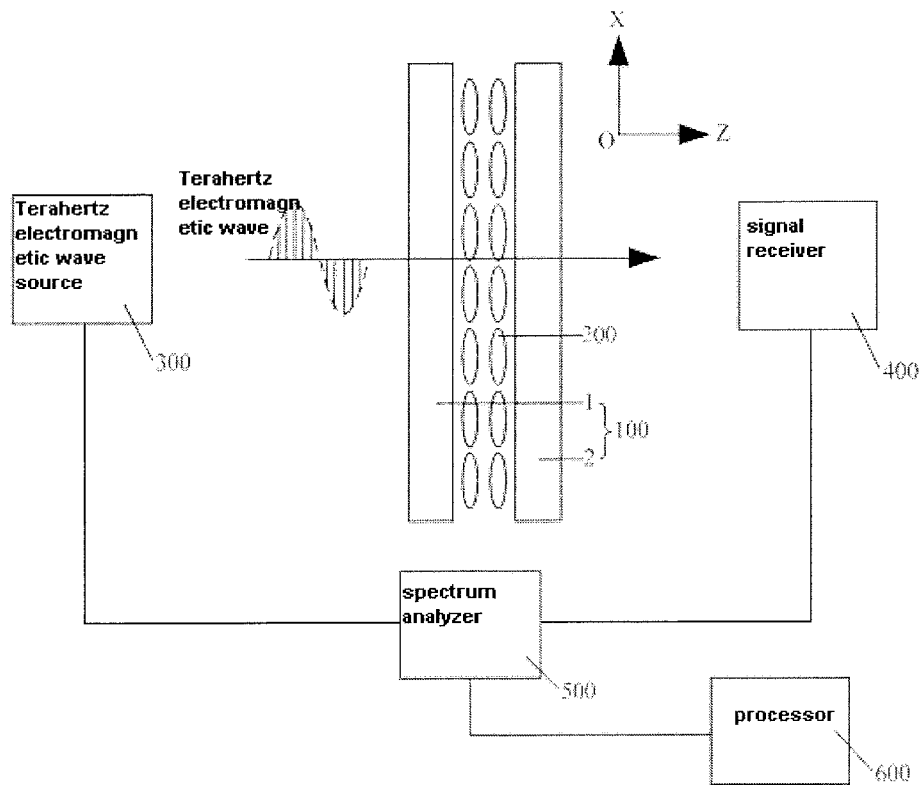
FIG. 10 is a schematic structural diagram of a measuring apparatus according to an embodiment of the present disclosure

Based on the above-mentioned measuring device and method for a dielectric constant of a liquid crystal, embodiments of the present disclosure provide a measuring apparatus for a dielectric constant of a liquid crystal, as shown in FIG. 10, the measuring apparatus includes: the measuring device 100 for a dielectric constant of a liquid crystal, a Terahertz electromagnetic wave source 300, a signal receiver 400, and a spectrum analyzer 500.

In the embodiment, the measuring device 100 for a dielectric constant of a liquid crystal is the measuring device 100 for a dielectric constant of a liquid crystal provided by the present disclosure which has the advantages of high measurement sensitivity and precision, a simple structure, a low cost, and a high measurement speed.

The terahertz electromagnetic wave source 300 is disposed at a side of the measuring device 100; exemplarily, as shown in FIG. 10, the terahertz electromagnetic wave source 300 is disposed at a side of the first substrate 1 of the measuring device 100 facing away from the second substrate 2. The terahertz electromagnetic wave source 300 is provided for transmitting terahertz electromagnetic waves to the measuring device 100 in a direction perpendicular to a plane of the measuring device 100; exemplarily, the terahertz electromagnetic wave source 300 in FIG. 10 transmits the terahertz electromagnetic waves to the measuring device 100 in the Z direction.

The signal receiver 400 is disposed at the other side of the measuring device 100; for example, the terahertz electromagnetic wave source 300 in FIG. 10 may alternatively be disposed at the side of the second substrate 2 of the measuring device 100 facing away from the first substrate 1. The signal receiver 400 is provided for receiving the terahertz electromagnetic waves transmitted through the measuring device 100.

The spectrum analyzer 500 is connected to both the terahertz electromagnetic wave source 300 and the signal receiver 400, for generating a curve of an intensity of the transmitted wave as a function of a frequency according to the terahertz electromagnetic wave emitted by the terahertz electromagnetic wave source 300 and the electromagnetic wave received by the signal receiver 400. Exemplarily, if the terahertz electromagnetic wave emitted by the terahertz electromagnetic wave source 300 is a time domain signal, the spectrum analyzer 500 may specifically be a time domain spectrum analyzer.

Based on the above-described measuring apparatus, further, referring to FIG. 10, the measuring apparatus may further include a processor 600 connected to the spectrum analyzer 500 and configured to perform the steps of S31 and S32 of the method of measuring a dielectric constant of a liquid crystal as provided by the present disclosure, that is, it is capable of performing simulation derivation, obtaining a dielectric constant of a liquid crystal in the long axis direction corresponding to the first curve and a dielectric constant of a liquid crystal in the short axis direction corresponding to the second curve.

The above description is only the specific embodiments of the present disclosure, but the scope of the present disclosure is not limited thereto, and any modifications or replacements that can be easily conceived by those skilled in the art within the technical scope of the present disclosure should be covered within the scope of protection of the present disclosure. Therefore, the scope of protection of the present disclosure should be subject to the scope of protection of the claims.

The invention claimed is:

1. A measuring device for a dielectric constant of a liquid crystal, wherein the measuring device comprises:
   a first substrate and a second substrate disposed to be opposite to each other; and
   a resonant structure layer disposed on a side of the first substrate facing the second substrate;
   wherein, a cavity for accommodating the liquid crystal to be measured is defined between the first substrate and the second substrate; and
   wherein the resonant structure layer comprises at least two sets of composite resonant structures, the sets of composite resonant structures are spaces apart from one another and each set of composite resonant structures comprise a primary resonant structure and a secondary resonant structure arranged to be spaces from each other.

2. The measuring device as claimed in claim 1, further comprising a first alignment film disposed on the side of the first substrate facing the second substrate and a second alignment film disposed on a side of the second substrate facing the first substrate.

3. The measuring device as claimed in claim 1, wherein a frame is provided between the first substrate and the second substrate, the frame together with the first substrate and the second substrate defining the cavity for accommodating the liquid crystal to be measured.

4. The measuring device as claimed in claim 1, wherein the at least two sets of composite resonant structures are arranged at circumferentially equal intervals around an axis perpendicular to a plane in which the first substrate is located, and the sets of composite resonance structures are centrally symmetrically distributed with respect to an intersection of the axis with the first substrate.

5. The measuring device as claimed in claim 1, wherein, in each set of composite resonant structures, the primary resonant structure comprises a primary metal strip, the secondary resonant structure comprises at least two secondary metal strips, the secondary metal strips are perpendicular to the primary metal strip, and the at least two secondary metal strips are symmetrically arranged relative to a perpendicular bisector of the primary metal strip.

6. The measuring device as claimed in claim 5, wherein a length of the secondary metal strip is less than a length of the primary metal strip, and a width of the secondary metal strip is less than a width of the primary metal strip.

7. The measuring device as claimed in claim 1, wherein the resonant structure layer comprises four sets of composite resonant structures, the four sets of composite resonant structures being arranged at circumferentially equal intervals around an axis perpendicular to the first substrate and the four sets of the composite resonant structures are centrally symmetrically distributed with respect to an intersection of the axis with the first substrate;
  in each set of composite resonant structures, the primary resonant structure includes a primary metal strip, the secondary resonant structure includes two secondary metal strips, the two secondary metal strips are perpendicular to the primary metal strip, the two secondary metal strips are symmetrically arranged with respect to a perpendicular bisector of the primary metal strip, and the secondary metal strips are located at a side of the primary metal strip away from the axis.

8. The measuring device as claimed in claim 1 wherein the resonant structure layer is made of a metal.

9. The measuring device as claimed in claim 1, wherein the resonant structure layer has a thickness ranged from 0.01 µm to 5 µm.

10. The measuring device as claimed in claim 1, wherein the cavity has a thickness ranged from 3 µm to 500 µm.

11. The measuring device as claimed in claim 2, wherein the first alignment film has a same alignment orientation as the second alignment film.

12. The measuring device as claimed in claim 2, wherein the first alignment film covers the resonant structure layer.

13. The measuring device as claimed in claim 3, wherein the frame is made of a sealant, and the frame includes a liquid crystal injection port for injecting the liquid crystal to be measured into the cavity.

14. A method of measuring a dielectric constant of a liquid crystal, wherein the method comprises:
  preparing a measuring device containing the liquid crystal to be measured, the measuring device being a measuring device for a dielectric constant of a liquid crystal as claimed in claim 1;
  irradiating the measuring device with a terahertz electromagnetic wave in a direction perpendicular to a plane where the measuring device is located with a polarization direction of the terahertz electromagnetic wave being parallel to a long axis of the liquid crystal in the measuring device, receiving the terahertz electromagnetic wave transmitted through the measuring device, and obtaining a first curve of an intensity of the transmitted terahertz electromagnetic wave as a function of a frequency;
  irradiating the measuring device with the terahertz electromagnetic wave in the direction perpendicular to the plane where the measuring device is located with the polarization direction of the terahertz electromagnetic wave being perpendicular to the long axis of the liquid crystal in the measuring device, receiving the terahertz electromagnetic wave transmitted through the measuring device, and obtaining a second curve of the intensity of the transmitted terahertz electromagnetic wave as the function of the frequency;
  finding a dielectric constant of the liquid crystal matching the first curve based on the first curve, and using the dielectric constant as a dielectric constant in a long axis direction of the liquid crystal, and finding a dielectric constant of the liquid crystal matching the second curve based on the second curve, and using the dielectric constant as a dielectric constant in a short axis direction of the liquid crystal.

15. The method as claimed in claim 14, wherein the dielectric constant of the liquid crystal matching the first curve is found based on the first curve by using a simulation method; and the dielectric constant of the liquid crystal matching the second curve is found based on the second curve by using a simulation method.

16. The method as claimed in claim 15, wherein the step of finding the dielectric constant of the liquid crystal in the long axis direction and the dielectric constant of the liquid crystal in the short axis direction by using a simulation method comprises:
  establishing a simulation model according to a measurement experimental model of the steps of obtaining the first curve and the second curve;
  adjusting the dielectric constant of the liquid crystal in the long axis direction in the simulation model, so that the simulation result obtained is consistent with the first curve and a corresponding dielectric constant of the liquid crystal in the long axis direction is the dielectric constant in the long axis direction of the liquid crystal to be measured;
  adjusting the dielectric constant of the liquid crystal in the short axis direction in the simulation model, so that the simulation result obtained is consistent with the second curve and a corresponding dielectric constant of the liquid crystal in the short axis direction is the dielectric constant in the short axis direction of the liquid crystal to be measured.

17. A measuring apparatus for a dielectric constant of a liquid crystal, wherein the measuring apparatus comprises:
  the measuring device for a dielectric constant of a liquid crystal as claimed in claim 1;
  a terahertz electromagnetic wave source disposed at a side of the measuring device;
  a signal receiver disposed at the other side of the measuring device;
  a spectrum analyzer connected to both the terahertz electromagnetic wave source and the signal receiver and configured for generating, according to a terahertz electromagnetic wave emitted by the terahertz electromagnetic wave source and the terahertz electromagnetic wave that is received by the signal receiver, a first curve and a second curve of an intensity of the terahertz electromagnetic wave transmitted as a function of a frequency.

18. The measuring apparatus as claimed in claim 17, wherein one of the terahertz electromagnetic wave source and the signal receiver is located at a side of the second substrate facing away from the first substrate, and the other is located at a side of the first substrate facing away from the second substrate.

19. The measuring apparatus as claimed in claim 17, wherein the measuring apparatus further comprises: a processor coupled to the spectrum analyzer and configured for performing a simulation derivation to obtain a dielectric constant in a long axis direction of the liquid crystal matching the first curve and a dielectric constant in a short axis direction of the liquid crystal matching the second curve.

* * * * *